(12) United States Patent
De Graauw et al.

(10) Patent No.: US 8,854,277 B2
(45) Date of Patent: Oct. 7, 2014

(54) MILLIMETRE-WAVE RADIO ANTENNA MODULE

(75) Inventors: Antonius Johannes Matheus De Graauw, Haelen (NL); Freek Egbert Van Straten, Mook (NL)

(73) Assignee: NXP, B.V., Eindhoven (NL)

( * ) Notice: Subject to any disclaimer, the term of this patent is extended or adjusted under 35 U.S.C. 154(b) by 590 days.

(21) Appl. No.: 13/129,760

(22) PCT Filed: Nov. 16, 2009

(86) PCT No.: PCT/IB2009/055084
§ 371 (c)(1),
(2), (4) Date: Aug. 11, 2011

(87) PCT Pub. No.: WO2010/058337
PCT Pub. Date: May 27, 2010

(65) Prior Publication Data
US 2011/0285606 A1    Nov. 24, 2011

(30) Foreign Application Priority Data
Nov. 19, 2008 (EP) .................................. 08105825

(51) Int. Cl.
*H01Q 1/22* (2006.01)
*H01L 23/498* (2006.01)
*H01L 23/66* (2006.01)
*H01Q 23/00* (2006.01)

(52) U.S. Cl.
CPC ....... *H01L 23/66* (2013.01); *H01L 2924/15311* (2013.01); *H01L 23/49816* (2013.01); *H01L 2224/16* (2013.01); *H01L 2223/6677* (2013.01); *H01L 2924/01019* (2013.01); *H01L 2224/16225* (2013.01); *H01L 2924/3011* (2013.01); *H01Q 23/00* (2013.01); *H01L 2924/1532* (2013.01)
USPC ........... 343/904; 343/725; 343/767; 455/90.2

(58) Field of Classification Search
USPC .......................... 343/904, 725, 767; 455/90.2
See application file for complete search history.

(56) References Cited

U.S. PATENT DOCUMENTS 6,770,955 B1    8/2004 Coccioli et al.
7,030,824 B1 *  4/2006 Taft et al. ...................... 343/767

(Continued)

FOREIGN PATENT DOCUMENTS

EP    1 126 522 A1    8/2001
EP    2 071 663 A1    6/2009

(Continued)

OTHER PUBLICATIONS

Pfeiffer, U. R., et al., "A Chip-Scale Packaging Technology for 60GHz Wireless Chipsets", IEEE Trans. on Microwave Theory and Techniques, vol. 54, No. 8, pp. 3387-3397 (Aug. 2006).

(Continued)

*Primary Examiner* — Allyson Trail

(57) ABSTRACT

A millimeter-wave radio antenna module (600) comprising: an antenna substrate (603) having an antenna (602) provided on a face thereof; and a semiconductor die (601) comprising a wireless system IC, the die mounted on a face of the antenna substrate and configured to provide a signal to the antenna, wherein a ball grid array (605) is formed on a face of the antenna substrate for mounting the antenna module to a circuit board, the ball grid array being configured to define an air dielectric gap (606) between the antenna and the circuit board.

19 Claims, 8 Drawing Sheets

(56) References Cited

U.S. PATENT DOCUMENTS

| | | |
|---|---|---|
| 7,808,434 B2 * | 10/2010 | White et al. ............ 343/700 MS |
| 2004/0155831 A1 * | 8/2004 | Goebel et al. ................. 343/775 |
| 2006/0276157 A1 | 12/2006 | Chen et al. |
| 2007/0164420 A1 | 7/2007 | Chen et al. |
| 2007/0164907 A1 | 7/2007 | Gaucher et al. |
| 2008/0291115 A1 | 11/2008 | Doan et al. |
| 2010/0255274 A1 * | 10/2010 | Mirsky et al. ................. 428/209 |

FOREIGN PATENT DOCUMENTS

| | | |
|---|---|---|
| JP | 2001-223604 A | 8/2001 |
| WO | 01/95679 A1 | 12/2001 |
| WO | 02/103750 A2 | 12/2002 |
| WO | 2004/080134 A2 | 9/2004 |

OTHER PUBLICATIONS

Chu, L. "Physical Limitations of Omni-Directional Antennas," J. Appl. Physics, vol. 19, pp. 1163-1175 (Dec. 1948).

Jackson, D., et al. "Simple Approximate Formulas for Input Resistance, Bandwidth and Efficiency of a Resonant Rectangular Patch", IEEE Trans. on Antennas and Propagation, vol. 39, No. 3, pp. 407-410 (Mar. 1991).

Khandelwal, N., et al. "An X-Band System-In-Package Active Antenna Module", Microwave Symposium Digest, 2005 IEEE MTT-S Int'l., pp. 1019-1022 (2005).

International Search Report and Written Opinion for Int'l. Patent Appln. No. PCT/IB2009/055084 (Feb. 4, 2010).

Constantine A. Balanis, "Antenna Theory 3nd ed,", ISBN-0-471-66782-X, pp. 811-812; 2005.

Waterhouse R.B., "Microstrip Patch Antennas, A Designers Guide", Kluwer Academic, Boston 2003; par. 3.6; 2003.

* cited by examiner

MILLIMETRE-WAVE RADIO ANTENNA MODULE

TECHNICAL FIELD OF THE INVENTION

The invention relates to packages for millimeter systems with integrated antennae, and in particular to antennae for millimeter wave transceiver systems.

BACKGROUND ART

The packaging of integrated circuits for mm-wave communication, radar and imaging systems has long been dominated by the use of expensive specialised technologies like low loss ceramics and thin-film processes. In addition, such packages tend to be mounted on specialised mm-wave substrates on which the antenna is integrated. An important motivation for the dedicated packaging technology and substrates is the need for a well defined interconnection between the transceiver and the antenna that offers low loss and low parasitic effects at mm-wave frequencies. Other requirements are a low thermal resistance between the active devices and the application board and mechanical reliability. The main motivation for the use of specialised low loss and low dielectric constant materials for antenna substrates relates to the good efficiency and impedance bandwidth characteristics achievable with such materials.

For the purposes of the present disclosure, the term millimeter-wave refers to radiofrequency signals covering a range of wavelengths generally of the order of millimeters, i.e. with a typical frequency range of 30 to 100 GHz (corresponding to 10 to 3 mm in wavelength). This particular range of wavelengths defines the dimensions of the antennae that are used, and therefore the particular packaging that is possible for transceiver systems operating over the relevant range of frequencies.

Millimeter-wave applications are at present entering mass consumer markets, resulting in a strong drive for low cost alternatives for packaging and board solutions. A major cost reduction can be achieved by integrating an antenna with the package, which relaxes the interconnect requirements on the board significantly since the mm-wave interconnect is then limited to the connections between the transceiver and antenna in the package, rather than through wired connections between different packages. Known packaging concepts do however still tend to require special expensive packages in order to integrate an antenna function.

One of the most popular antenna types for use in wireless communication, radar and imaging equipment is the micro-strip antenna. This type of antenna is a low profile, mechanically simple, robust and inexpensive structure that can be used as a single element radiator, but can also be used to construct linear and planar conformal antenna arrays [1]. Important specifications for such applications include: i) the impedance bandwidth, which defines the efficiency of the transfer of available source power to the antenna; and ii) the gain, which defines the efficiency of the conversion of this power to radiated power and the directivity of the radiated waves.

The impedance bandwidth of a resonant antenna is a function of the effective antenna volume. This volume is strongly dependent on the thickness and permittivity of the antenna dielectric. The following equations show the general relationship between impedance bandwidth and effective antenna volume [2]:

$$Q_{ant} > \eta \cdot \left( \frac{1}{(k,r)^3} + \frac{1}{(k,r)} \right) \approx \eta \cdot \left( \frac{1}{(k,r)^3} \right) \quad (1)$$

$$BW = \frac{vswr - 1}{Q_{ant} \cdot \sqrt{vswr}} \quad (2)$$

where $Q_{ant}$ is the minimum antenna quality factor, $\eta$ is the antenna efficiency, k is the wave number ($k=2\pi/\lambda$) and r is the radius of the smallest sphere circumscribing the antenna.

FIG. 1 (derived from reference [3]) shows the impedance bandwidth of a standard square shaped patch antenna as function of substrate thickness and dielectric constant. As the substrate thickness increases, the 2:1 VSWR Bandwidth increases. The quantity on the x-axis of FIG. 1 (and also on FIG. 2) is the ratio of the substrate thickness t to the free space wavelength $\lambda$, resulting in the dimensionless quantity of relative substrate thickness, $t/\lambda$. The different curves shown in FIG. 1 represent results for different values of relative dielectric constant, ranging from 1.0 (for air/free space) to 9.8.

The gain, G, of an antenna is defined by the product of efficiency and directivity, given by the following equation:

$$G = \eta \cdot D \quad (3)$$

in which $\eta$ is the power efficiency and D the directivity of the antenna. The directivity is mainly defined by the spatial distribution and orientation of the radiators, ground-planes and substrates (or superstrates). The efficiency of micro-strip antennas is not only defined by dielectric and conductive material losses but also by the power lost in the surface wave that can be launched in the substrate. The energy in this wave, which is partly transmitted into free space at the substrate edges and partly dissipated in the substrate, is generally considered as lost energy since it does not contribute to the radiation emitted in the desired direction (typically orthogonal to the plane of the antenna). FIG. 2 (also derived from reference [3]) shows the surface wave efficiency of a standard square shaped patch antenna, also as a function of the substrate thickness and dielectric constant. Again, an increase in dielectric constant results in increased losses due to surface wave losses.

The above mentioned results show a clear trade-off between impedance bandwidth, which increases with substrate thickness, and surface wave efficiency, which decreases with substrate thickness. The results also show that both bandwidth and efficiency can be improved by reducing the dielectric constant of the substrate.

Various technology and assembly methods are known at present to realise micro-strip antennas that are optimized with respect to impedance bandwidth and efficiency, for example as disclosed in reference [4], in which a laminate having a low dielectric constant and low loss at microwave frequencies is used as a dielectric between a patch antenna and a ground-plane. This type of structure is illustrated in FIG. 3, in which a patch antenna 301 is separated from a ground plane 302 by a dielectric medium 303, in this case composed of a PTFE-based composite material (known as 'RT-Duroid'). The whole antenna package 300 is connected to an underlying substrate or motherboard 304 by means of solder balls 305 in the form of a ball grid array (BGA). Microwave ICs 306, 307 are mounted to the underside of the dielectric medium 303. This approach is typical for such antennas, where dielectric materials such as PTFE (polytetrafluoroethylene) are commonly used.

FIG. 4 shows a further antenna and transceiver module 400, proposed in reference [5], in which an air gap is provided between the antenna 401 and the ground plane 402. The antenna 401 is patterned on a fused silica dielectric superstrate 403. The superstrate 403 is bonded on to a metal frame 404, with the antenna 401 on the underside of the superstrate and electrically connected to a laterally offset transceiver IC 405 using a conductive adhesive. The antenna 401 is thereby suspended in air beneath the superstrate 403, and the metallic base plate 402 of the package 400 acts as a reflecting ground plane. The package 400 is connected to an underlying substrate (not shown) via a land grid array.

FIG. 5 shows a further antenna construction, shown in an exploded perspective view, as disclosed in reference [6]. In this case the bandwidth of the antenna is improved by the use of multiple parasitic resonators, which are coupled to the driven antenna patch 501 across multiple dielectric layers $\in_{r1}$ to $\in_{r8}$. The use of multiple resonators increases the order (number of poles) of the system and allows for a trade-off to be made between impedance bandwidth and the quality of the match. This structure is an example of a class of antennae employing multiple resonators either in the form of adding extra antenna elements or by combining single antenna radiators with lumped circuit resonators.

These known methods for realising a System in a Package (SiP) with an integrated micro-strip antenna have a number of disadvantages.

A general disadvantage of the known concepts is that the transceiver and antenna use different substrates as a result of the different requirements for the antenna and the transceiver. The substrate requirements for the transceiver typically include a high density flip-chip interconnect and a low thermal resistance. Requirements for the antenna, on the other hand, relate to the dielectric thickness, relative dielectric constant and material losses. The disadvantage of using different substrates in a SiP is that the resulting interconnect-structure is generally quite complex, resulting in efficiency and bandwidth losses due to parasitic effects.

In addition, a drawback of using special substrate (or superstrate) materials having a low dielectric constant and low loss is that such materials are in general incompatible with mainstream large volume mass production processes. PTFE-based materials such as RT-Duroid™ ($\in_r$=2.9, tan δ=0.0012), Ultralam2000™ ($\in_r$=2.5, tan δ=0.0022) or extruded polystyrene foam ($\in_r$≈1.1, tan δ<0.002) are substantially more expensive due to the low production volumes and the requirement to accurately control and guarantee the dielectric properties up to high frequencies.

In addition, the mechanical and thermal properties of typical dielectric materials deviate substantially from other standard laminate materials such as epoxy, which makes the materials less suitable for standard assembly methods such as fine pitch flip-chip and ball grid array packaging.

Furthermore, the performance of current approaches is still limited by the dielectric constant of the material used, which is typically significantly higher that that of free space.

OBJECT OF INVENTION

An object of the invention is to address one or more of the above mentioned problems and to provide a new low cost packaging concept for mm-wave systems having an integrated antenna.

SUMMARY OF INVENTION

In accordance with a first aspect of the invention there is provided a millimeter-wave radio antenna module comprising:

an antenna substrate having an antenna provided on a face thereof; and a semiconductor die comprising a wireless system IC, the die mounted on a face of the antenna substrate and configured to provide a signal to the antenna, wherein a ball grid array is formed on a face of the antenna substrate for mounting the antenna module to a circuit board and configured to define an air dielectric gap between the antenna and an underlying substrate to which the module is configured to be mounted.

The antenna may be provided on a first face of the antenna substrate and the semiconductor die mounted to a second opposing face of the antenna substrate. Alternatively, the antenna may be provided on the same face of the antenna substrate to which the semiconductor die is mounted. In either case, the ball grid array may be formed on the same face of the antenna substrate to which the semiconductor die is mounted, or on the opposing face.

The wireless system IC (integrated circuit) comprises a receiver and/or a transmitter, i.e. is operable to receive signals from or transmit signals to the antenna at millimeter wave frequencies.

The module can be used for low cost packaging of integrated circuits and antennae, or arrays of antennae, in mm-wave communication, radar and imaging systems The module achieves a space saving by using an air gap, created by a ball grid array between the package and the application board in a laminate based package, as a high quality dielectric for a mm-wave antenna. The construction is also able to provide a low thermal resistance path between the active devices on the semiconductor IC and the board, through the use of the ball grid array.

An outer portion of the ball grid array preferably surrounds the antenna, functioning to robustly support the substrate on which the antenna is provided and to define the gap between the antenna substrate and a ground plane on the circuit board. An inner portion of the ball grid array may be provided to electrically connect the semiconductor die to the circuit board. The inner portion of the ball grid array may be provided to thermally connect the semiconductor die to the circuit board via the antenna substrate. The ball grid array can thereby serve at least four main functions: i) to provide a robust join between the antenna module and an underlying circuit board substrate; ii) to provide electrical connections between the semiconductor die and the underlying substrate; iii) to provide thermal paths for heat to be conducted away from the semiconductor die; and iv) to accurately define the dielectric gap between the antenna and the ground plane on the circuit board.

The antenna may comprise a plurality of antenna in the form of a phased array antenna, for example having a half wavelength spacing. The wavelength may be within the range from approximately 10 mm to 3 mm.

Preferably the thickness of the antenna substrate is less than that of the dielectric air gap between the antenna substrate and the ground plane. By having a thin antenna substrate compared to the air dielectric gap, the effect of the substrate material on the performance of the antenna can be reduced. More preferably, the thickness of the antenna substrate is at most half that of the air dielectric gap. Particular exemplary thicknesses are 200 microns for the antenna substrate and 500 microns for the air dielectric gap, suitable for operation at 60 GHz, corresponding to a free space wavelength of 5 mm.

In accordance with a second aspect of the invention there is provided a method of manufacturing a millimeter-wave radio antenna module, the method comprising the steps of:

providing an antenna substrate having an antenna on a face thereof;

mounting a semiconductor die comprising a wireless system IC on a face of the antenna substrate, the wireless system IC configured to provide a signal to the antenna; and forming a ball grid array on a face of the antenna substrate for mounting the antenna module to a circuit board, the ball grid array having an outer portion configured to define an air gap between the antenna and the circuit board and an inner portion configured to provide electrical connections between the circuit board and the semiconductor die.

It is to be understood that the above method steps may not necessarily be performed in strict order as written. For example, the ball grid array may be provided prior to mounting the semiconductor die on the antenna substrate.

BRIEF DESCRIPTION OF THE DRAWINGS

Embodiments of the invention will now be described by way of example, and with reference to the accompanying drawings in which:

FIG. 7b is a schematic plan view of the integrated active die and micro-strip antenna of FIG. 7a;

FIG. 12b is a plan view of a portion of the package of FIG. 12a.

SPECIFIC DESCRIPTION OF THE EMBODIMENTS

FIGS. 1 to 5 have already been discussed above in relation to the background to the invention.

Figure 6:
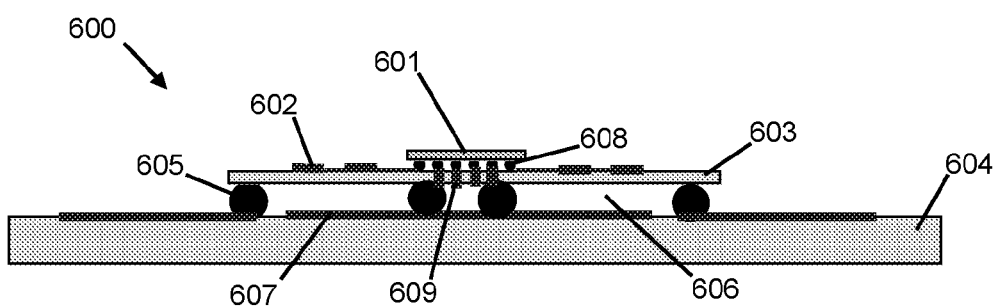
FIG. 6 is a schematic cross-sectional view of an integrated active die and micro-strip antenna in a ball grid array package mounted on a motherboard.

An embodiment of an antenna module package 600 according to the invention is illustrated in a schematic cross-section shown in FIG. 6. The package 600 comprises an active semiconductor die 601 and a micro-strip antenna 602 formed on a standard BT (Bismaleimide Triazine) epoxy laminate substrate 603. The die 601 is mounted on the same substrate 603 as the antenna 602, and the antenna substrate 603 is mounted on an underlying substrate or motherboard 604 by means of a ball grid array comprising an array of conductive balls 605.

Figure 1:
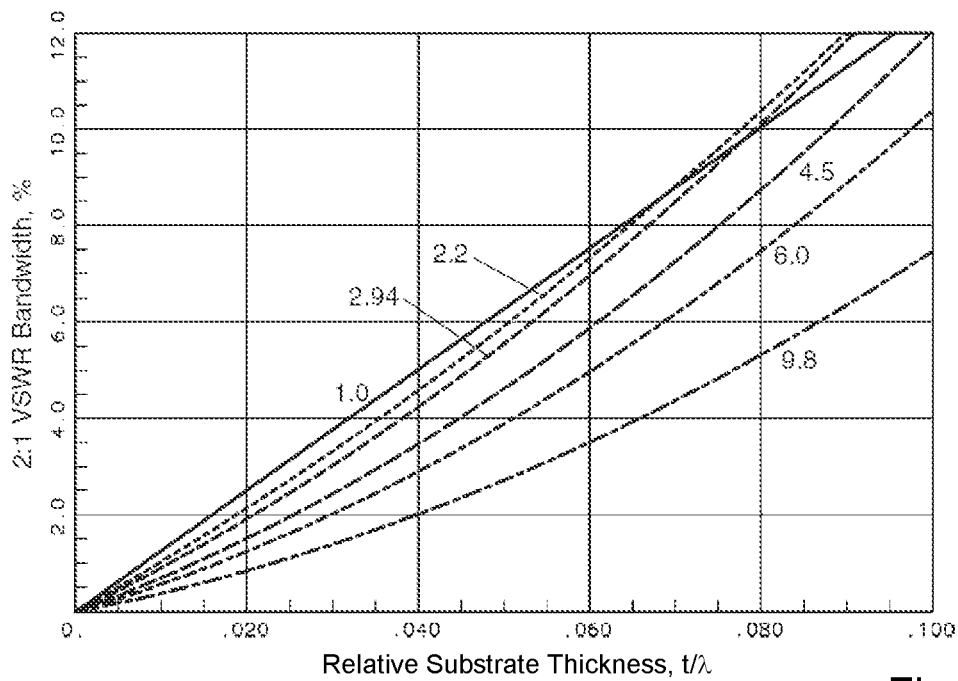
FIG. 1 illustrates a series of measurements of bandwidth of a square shaped micro-strip patch antenna as a function of substrate thickness and permittivity.

An important feature of the antenna module construction shown in FIG. 1 is the use of the air dielectric gap 606 between the antenna substrate 603 and a ground plane 607 on the motherboard 604. The air gap 606 acts as a high quality dielectric medium for the micro-strip antenna 602. This method of construction results in various advantages, detailed as follows.

Figure 2:
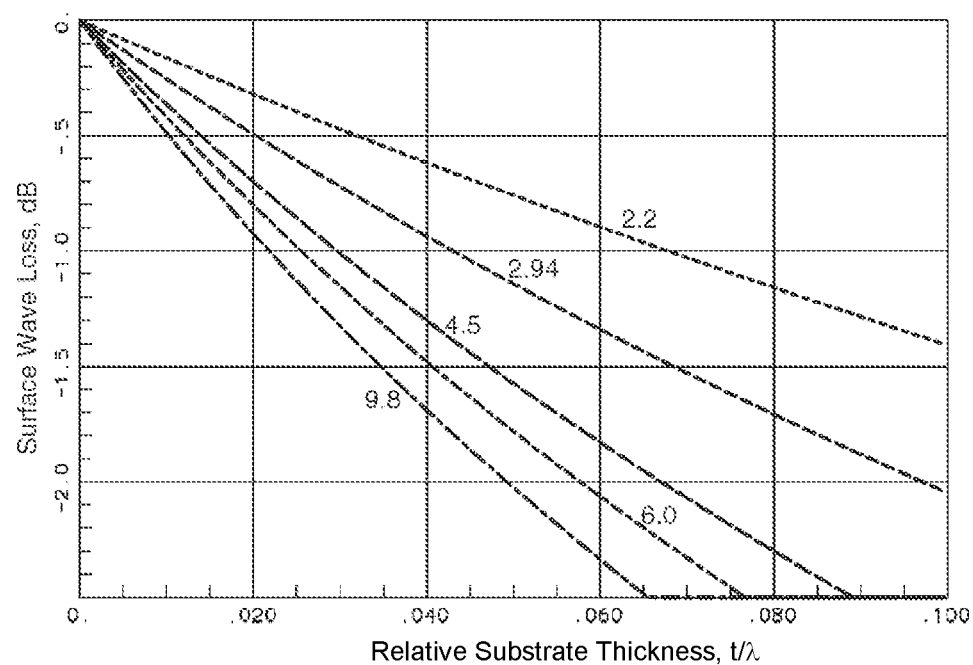
FIG. 2 illustrates a series of measurements of surface wave loss of a square shaped micro-strip patch antenna as a function of substrate thickness and permittivity.
Figure 3:
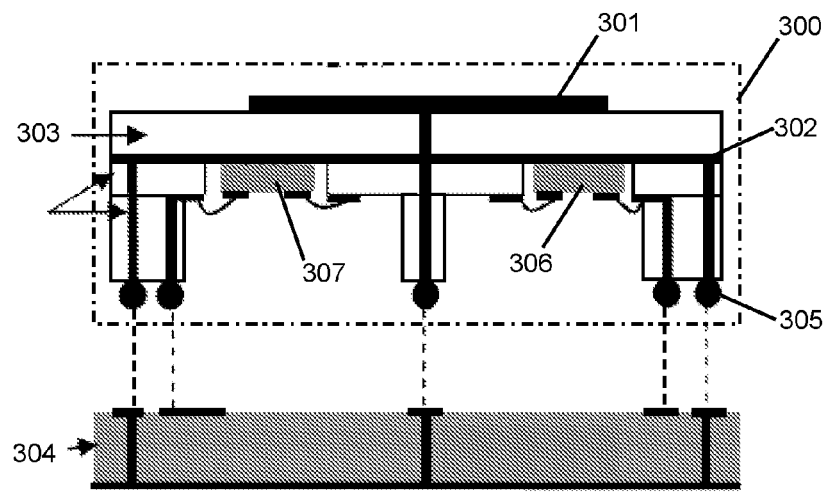
FIG. 3 is a schematic cross-sectional view of a patch antenna on a microwave substrate.
Figure 4:
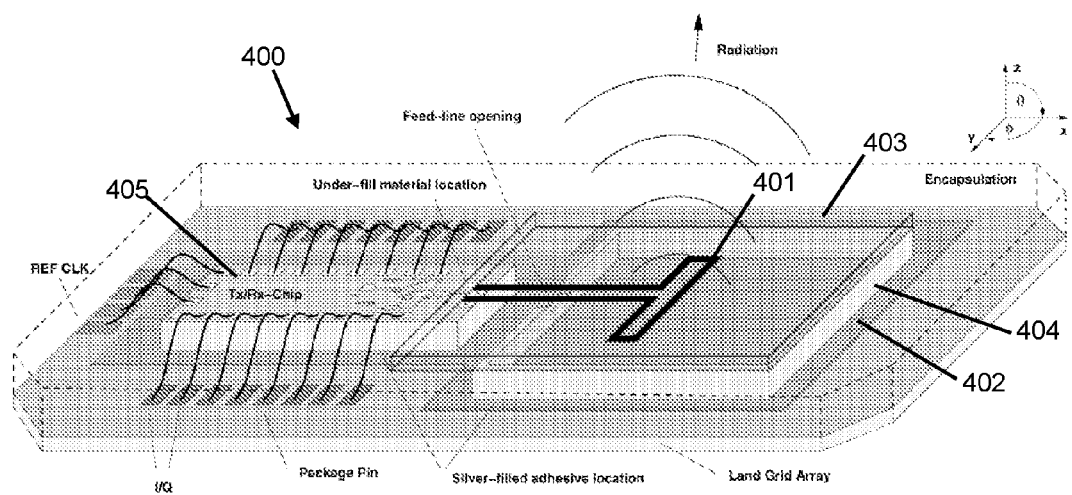
FIG. 4 is a schematic perspective view of a folded dipole antenna module on a suspended fused silica superstrate.
Figure 5:
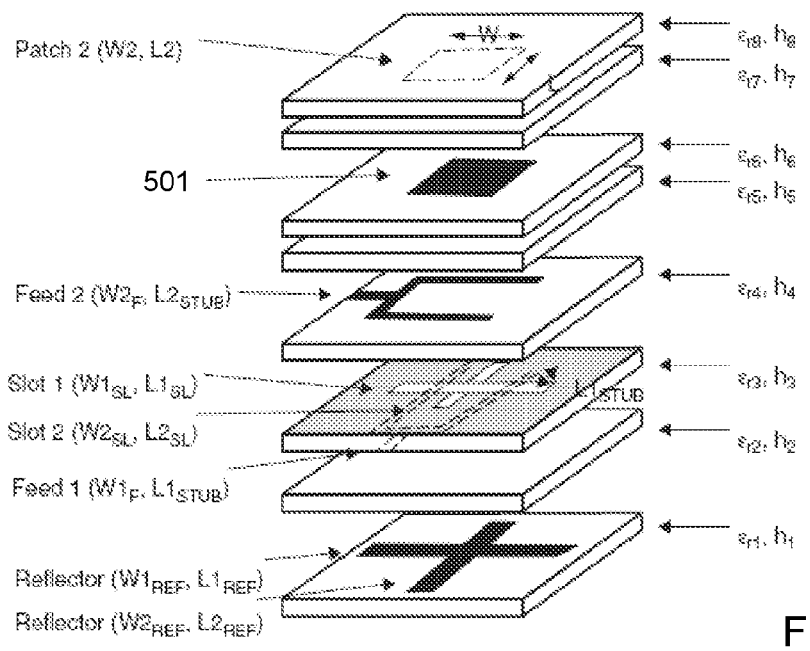
FIG. 5 is a schematic exploded perspective view of a patch antenna with multiple resonator elements.

The low dielectric constant and low loss of the air gap 606 ($\in_r=1$, tan $\delta=0$) is ideal for micro-strip antennas due to the improvements in impedance bandwidth and surface wave efficiency, as demonstrated in FIGS. 1 and 2.

The additional effective antenna volume created by the use of the, otherwise wasted, volume of the gap between the package and the board offers increased bandwidth performance without an increase in package area or height.

Figure 10A:
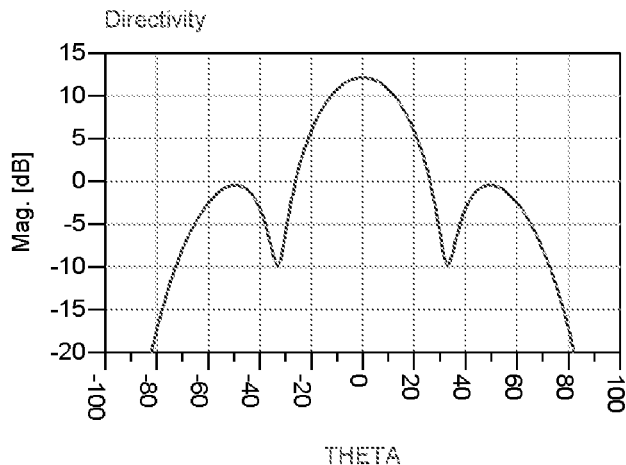
FIGS. 10a, 10b and 10c are plots of directivity as a function of scan angle for an array of 4 folded dipole elements.
Figure 10B:
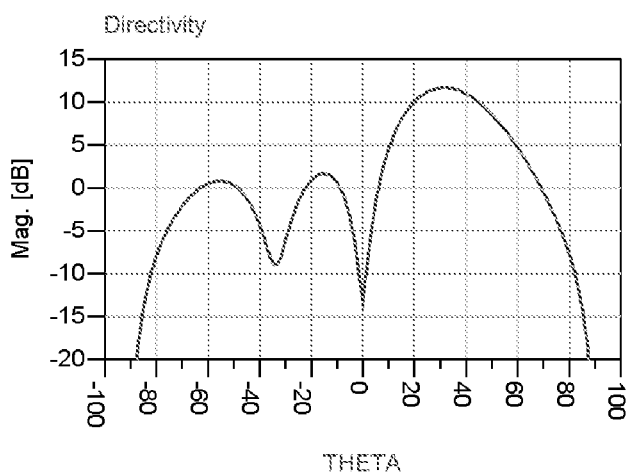
Figure 10C:
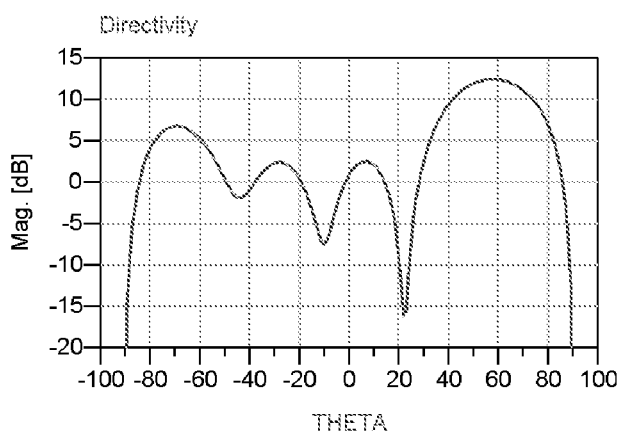

The extra effective antenna volume is created without increasing the surface area (or aperture) of the antenna 602, which would increase the directivity of the elements and in this way limit the range of angles over which the array can be scanned. The large scanning range possible using an antenna module according to an embodiment of the invention is shown in FIGS. 10a-c.

The antenna module 600 is suitable for use with standard laminate materials as the antenna substrate. The dielectric properties of the combination of a thin dielectric layer with a thick air gap tend to be dominated by the properties of the air layer. This significantly relaxes the requirements on the dielectric constant and dielectric loss of the antenna substrate 603.

The antenna module is also suitable for use in a standard BGA assembly process. The thickness of the air dielectric 606 is determined by the stand-off height of the package, which is a well-controlled parameter in high volume assembly processes.

A second important feature of the antenna module 600 is that connections between the transceiver module 601 and antenna 602 can be simplified. Metal traces provided on the surface of the antenna substrate 603 can connect directly to a smaller ball grid array connecting the transceiver die 601 to the antenna substrate 603 via solder balls 608. The antenna 602 is therefore preferably provided on the same face of the substrate 603 to which the transceiver module 601 is mounted. These features offer further advantages compared to more complex interconnect structures, including: i) a larger frequency bandwidth and lower signal loss due to reduced parasitic effects; ii) reduced coupling between the elements of a phased array antenna structure, which improves gain in the desired direction and suppress gain in the direction of interference; and iii) the construction is simpler to model, thus reduces design time.

A further feature of the antenna module embodiment illustrated in FIG. 6 is that of embedding a low thermal resistance path between the active die 601 and the ground plane 607 of a circuit board forming an underlying substrate or motherboard 604. This can be achieved through combining the smaller ball grid array mounting the die 601 to the antenna substrate with an array of thermal vias 609 passing through the antenna substrate 603 and in thermal communication with an inner portion of the larger ball grid array connecting the antenna substrate 603 with the motherboard 604. This combination of features functions as a heat sink, thereby limiting the maximum device temperature of the die 601, which is particularly important when applied to power intensive circuits such as power amplifiers and high speed digital circuits. The maximum operating temperature can be directly related to the lifetime of these circuits, so any step to reduce this can prolong the life of the module 600.

A particular application of the antenna module is in the integration of a transceiver chip with a phased array antenna for mm-wave communication, radar or imaging applications. FIG. 7 (not to scale) illustrates an example of such an application, in the form of a cross-sectional view (FIG. 7a) and a plan view (FIG. 7b) of a module comprising a 60 GHz wireless HDMI transceiver die together with a four element linear phased array antenna with half wavelength ($\lambda/2$) element spacing. The cross-sectional view in FIG. 7a is similar to the antenna module 600 shown in FIG. 6, and corresponding reference signs apply.

The antenna array 602 is formed on a standard BT laminate substrate 603, with $\epsilon_r$=3.8 and tan $\delta$=0.01. A mm-wave interconnect to the transceiver IC 601 is realised with a grid of 100 μm diameter solder balls 608. A grid of 500 μm diameter solder balls 605 is used to define the air dielectric gap between the antenna 602 and the ground plane 607, and also for a low frequency interconnect between the transceiver IC and the motherboard 604.

Figure 7A:
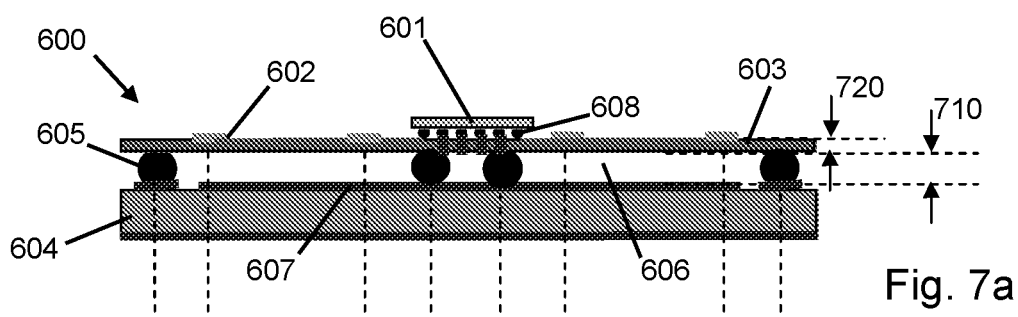
FIG. 7a is a further schematic cross-sectional view of the integrated active die and micro-strip antenna of FIG. 6.
Figure 7B:
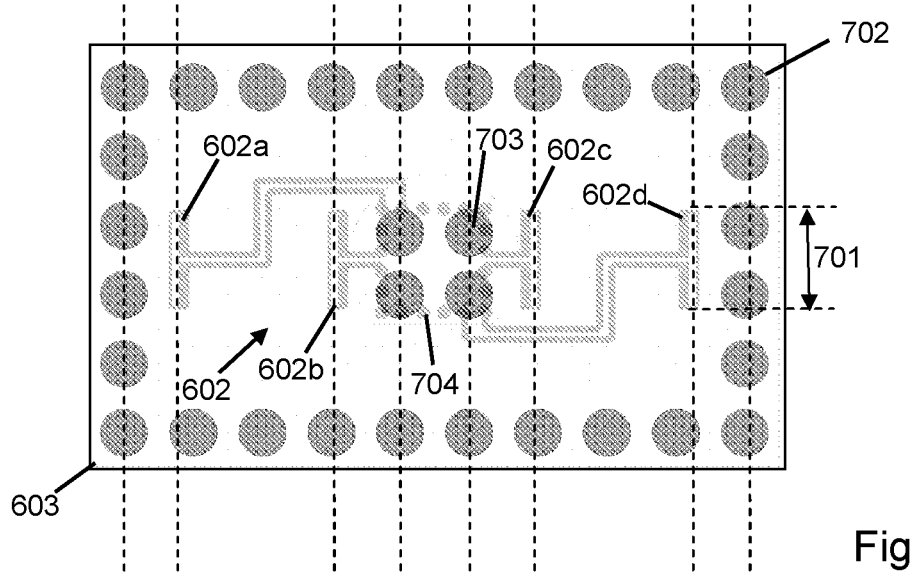

As shown in FIG. 7a, the thickness 710 of the air dielectric gap is greater than the thickness 720 of the antenna substrate, thereby allowing the dielectric properties of the air gap 606 to dominate. The air gap thickness 710 is preferably at least twice the thickness 720 of the antenna substrate. A typical thickness of the antenna substrate is around 200 μm, while the air gap thickness may be around 500 μm, for example between 400 and 600 μm for operation at 60 GHz, corresponding to a free space wavelength of 5 mm.

The antenna array 602 comprises four antenna elements 602a-d, the elements being spaced from each other by a half wavelength, in this case by 2.5 mm ($\lambda$=5 mm, f=60 GHz). Each of the antenna elements is in the form of a folded dipole, and has a span 701 of 1.5 mm.

The larger BGA comprises an outer ring 702 of balls surrounding the antenna array 602, and an inner grid 703 of balls connecting the transceiver IC 601, both electrically and thermally, to the motherboard 604. The smaller BGA 704 shown in FIG. 7b connects the transceiver IC 601 (not shown in FIG. 7b) to the antenna substrate 603.

Figure 8A:
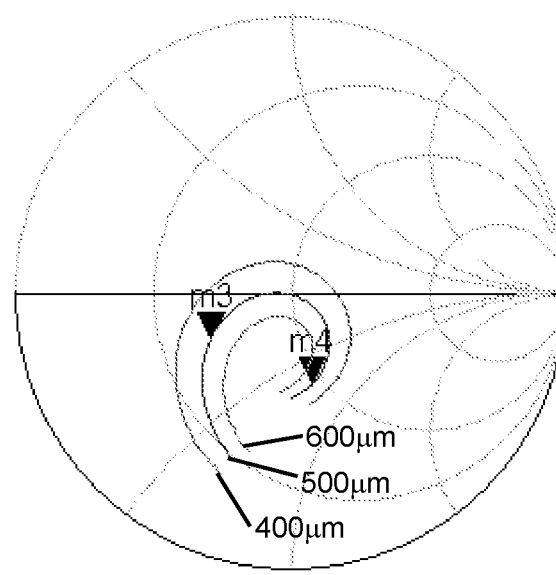
FIGS. 8a and 8b are plots of impedance bandwidth of a dipole antenna element as a function of air dielectric thickness.
Figure 8B:
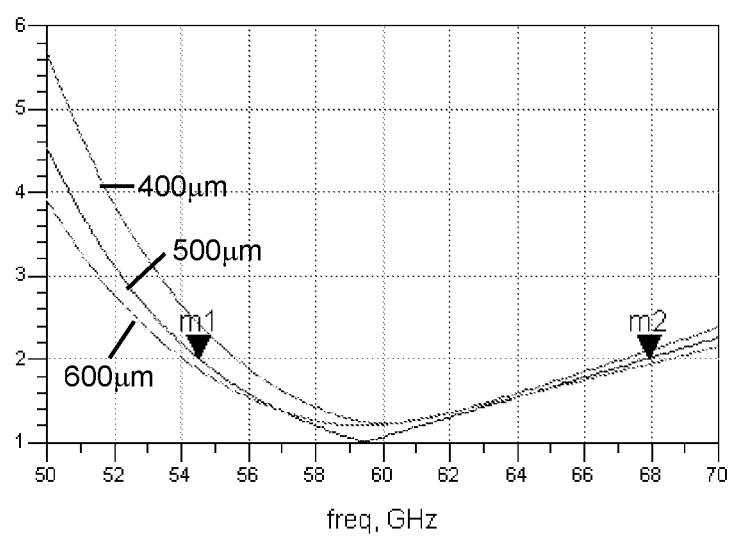

The performance of the antenna array 602 has been analysed by performing a number of electro-magnetic simulations. FIGS. 8a and 8b show the impedance bandwidth of a single folded dipole element for a nominal air dielectric gap thickness of 400 μm, 500 μm and 600 μm to investigate the effect of process spread. Points m1 and m2 on FIG. 8b indicate where the measured VSWR=2 for a 500 μm air gap, point m1 being at 54.5 GHz, point m2 being at 67.9 GHz. The nominal 2:1 VSWR impedance bandwidth is over 15% for each of the thicknesses of air gaps shown, thereby demonstrating the wide bandwidth capability of the antenna module.

Figure 9A:
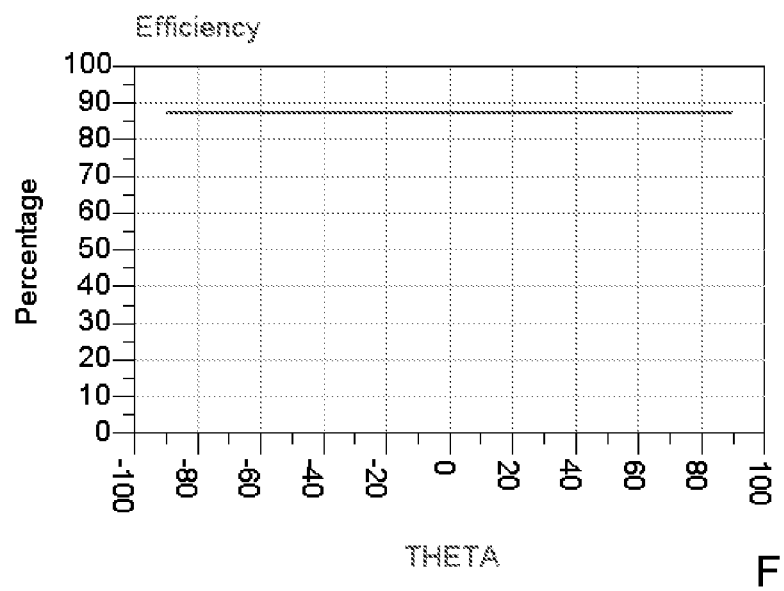
FIG. 9a is a plot of radiation efficiency of a dipole element.
Figure 9B:
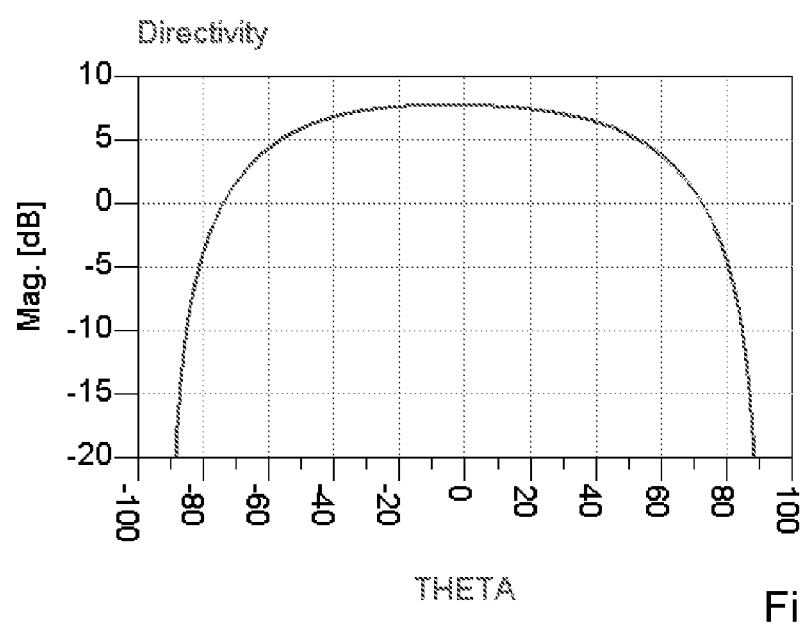
FIG. 9b is a plot of directivity of a dipole element.

FIGS. 9a and 9b show results from a simulation of radiation efficiency (FIG. 9a) and directivity (FIG. 9b) of a single folded dipole element of the antenna module. These results indicate that less that 20% of the power is lost in surface waves and dissipation in the dielectric and conductors, and demonstrate that air acts as an efficient antenna dielectric. The directivity of the antenna is mainly created by the groundplane beneath the antenna, which acts as a reflector to concentrate the transmitted radio energy in a direction orthogonal to the ground plane and antenna substrate.

FIGS. 10a to 10c show results of the directivity of the antenna module of FIG. 7, as a function of scan angle $\theta$, in the cases where the phase of the input signals are selected for maximum radiation in the directions $\theta$=0° (FIG. 10a), $\theta$=30° (FIG. 10b) and $\theta$=60° (FIG. 10c), the value for $\theta$ indicating the angle with respect to the normal to the plane of the antenna substrate. The possibility of scanning over such a large range is related to the relatively large distance between the antenna and the ground plane in the antenna module.

Figure 11:
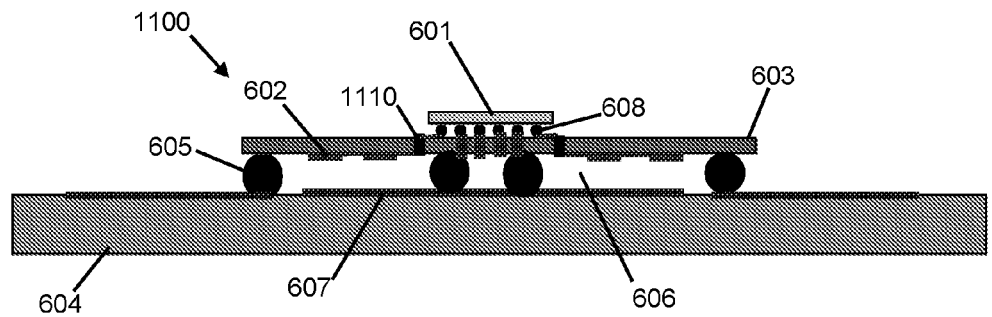
FIG. 11 is a schematic cross-sectional view of an alternative embodiment of an integrated active die and micro-strip antenna in a ball grid array package mounted on a motherboard.

FIG. 11 illustrates an alternative embodiment of an antenna module 1100, in which the antenna array 602 is provided on a face of the antenna substrate opposing the face on which the semiconductor die 601 is mounted. Interconnections between the die 601 and the antenna array 602 are achieved by means of via connections 1110. The remaining features of the module 1100 are otherwise similar to those of the embodiment in FIG. 6 described above. Having the antenna array 602 on the underside of the antenna substrate 603, i.e. using the antenna substrate 603 as a superstrate for the antenna 602, offers the possibility of increasing the gain per element of the array, at the cost of a reduction in angular coverage. This particular embodiment would therefore be more suitable for fixed beam applications.

Figure 12A:
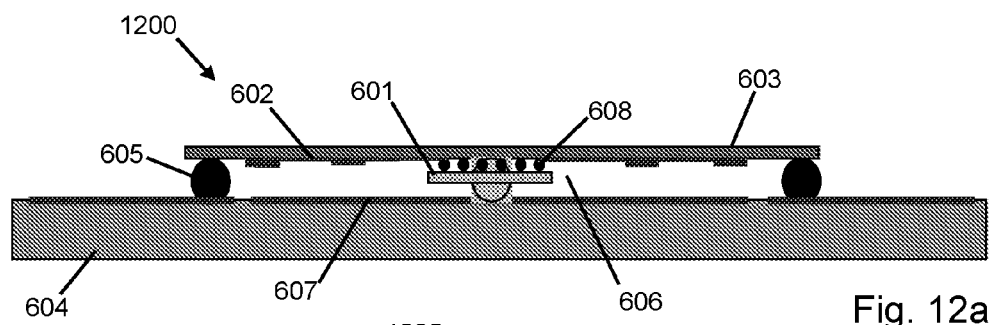
FIG. 12a is a schematic cross-sectional view of a further alternative embodiment of an integrated active die and micro-strip antenna in a ball grid array package mounted on a motherboard.
Figure 12B:
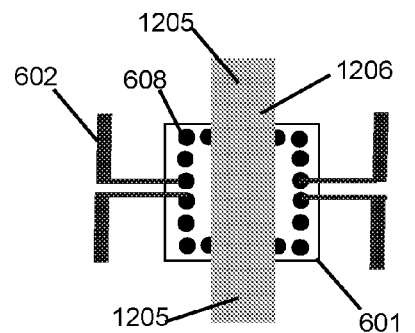

FIG. 12a shows a further alternative embodiment of an antenna module 1200, in which the semiconductor die 601 is mounted on the same face as the antenna array 602, but with both mounted on the underside of the antenna substrate and on the same face as the ball grid array 605. As compared with the embodiment of FIG. 11, interconnections between the die 601 and antenna array 602, as well as between the die and the underlying circuit board 604, are simplified, requiring no via connections through the antenna substrate 603. As with the embodiment of FIG. 11, using the antenna substrate 603 as a superstrate for the antenna 602 offers the possibility of increasing the gain per element of the array, at the cost of a reduction in angular coverage. The overall module 1200 occupies even less space than the embodiments illustrated above. Because the die 601 is connected to the underside of the antenna substrate 603, thermal connections to the circuit board 604 are made via a heat pipe arrangement, illustrated in plan view in FIG. 12b. A thermally conductive heat pipe 1206 connected to an inner ball grid array 1205 conducts heat away from the die 601 into the circuit board 604. In this arrangement, the height of the semiconductor die 601 and smaller ball grid array 608 is restricted to the thickness provided by the larger ball grid array 605 connecting the antenna substrate 603 to the circuit board 604 and defining the air dielectric gap 606 between the antenna 602 and the ground plane 607 on the circuit board 604.

Other potential applications of the proposed antenna module include integration of other types of micro-strip- or slot-radiators (e.g. open dipole, patches, cavity backed slots etc.), and integration of other array configurations (e.g. rectangular arrays, circular arrays etc.).

Antenna modules of the type described herein can be used for low cost packaging of integrated circuits and antennae (or antenna arrays) for mm-wave communication, radar and imaging systems. A first example is the use in 60 GHz wireless systems for distribution of high quality streaming video signals, or for the transfer of ultra high bit-rate data streams. A second example is the use in 77 GHz car radar systems for adaptive cruise control. A third example is the use of this concept above 100 GHz for imaging based security systems.

Other embodiments are intentionally within the scope of the invention as defined by the appended claims.

REFERENCES

[1] Constantine A. Balanis, "Antenna Theory $3^{rd}$ ed,", ISBN-0-471-66782-X, pp. 811-812.
[2] L. J. Chu, "Physical limitations of omni-directional antennas", J. Applied Physics, vol. 19, pp. 1163-1175, 1948.
[3] D. R. Jackson and N. G. Alexopoulas, Simple approximate formulas for input resistance, bandwidth and efficiency of a resonant rectangular patch, *IEEE Transactions on Antennas and Propagation*, vol. 39, no. 3, March 1991, pp 407-410.
[4] Khandelwal N. and Jackson R. W., "An X-band System-in-Package Active Antenna Module", 0-7803-8846-1/05/$20.00(C) 2005 IEEE.
[5] Pfeiffer U. R. et al, "A Chip-Scale Packaging Technology for 60 GHz Wireless Chipsets", *IEEE Transactions on Microwave Theory and Techniques*, vol. 54, no. 8, August 2006, pp. 3387-3395.
[6] Waterhouse R. B., *"Microstrip Patch Antennas, A Designers Guide"*, Kluwer Academic, Boston 2003. par. 3.6.

The invention claimed is:

1. A millimeter-wave radio antenna module comprising:
   an antenna substrate having an antenna provided on a face thereof; and
   a semiconductor die including a wireless system IC, the die mounted on a face of the antenna substrate and configured to provide a signal to the antenna,
   wherein a ball grid array is formed on a face of the antenna substrate for mounting the antenna module to a circuit board, the ball grid array being configured to define an air dielectric gap between the antenna and the circuit board;
   wherein the antenna comprises a plurality of antenna elements spaced laterally across the antenna substrate to provide a phased antenna array.

2. The antenna module of claim 1 wherein the antenna is provided on a first face of the antenna substrate and the semiconductor die is mounted to a second opposing face of the antenna substrate.

3. The antenna module of claim 2 wherein an inner portion of the ball grid array is configured to thermally connect the semiconductor die to the circuit board via the antenna substrate.

4. The antenna module of claim 1 wherein the antenna is provided on the same face of the antenna substrate to which the semiconductor die is mounted.

5. The antenna module of claim 1 wherein the ball grid array is formed on the same face of the antenna substrate to which the semiconductor die is mounted.

6. The antenna module of claim 1 wherein an outer portion of the ball grid array surrounds the antenna.

7. The antenna module of claim 1 wherein an inner portion of the ball grid array is configured to electrically connect the semiconductor die to the circuit board.

8. The antenna module of claim 1 wherein the plurality of antenna elements are spaced with a half wavelength spacing.

9. The antenna module of claim 8 wherein the wavelength is within a range from approximately 10 mm to 3 mm.

10. The antenna module of claim 1 wherein the antenna substrate has a thickness less than a thickness of the air gap defined by the ball grid array.

11. The antenna module of claim 10 wherein the antenna substrate thickness is less than half the thickness of the air gap.

12. The antenna module of claim 11 wherein the air gap is approximately 500 μm.

13. The antenna module of claim 11 wherein the antenna substrate thickness is approximately 200 μm.

14. The antenna module of claim 1 wherein the antenna substrate is mounted to the circuit board by the ball grid array to define the air dielectric gap between the antenna and a ground plane on the circuit board.

15. The antenna module of claim 1 wherein the plurality of antenna elements comprises folded dipole antennas.

16. A method of manufacturing a millimeter-wave radio antenna module, the method comprising the steps of:
   providing an antenna substrate having an antenna on a face thereof, wherein the antenna comprises a plurality of antenna elements spaced laterally across the antenna substrate to provide a phased antenna array;
   mounting a semiconductor die including a wireless system IC on a face of the antenna substrate, the wireless system IC configured to provide a signal to the antenna; and
   forming a ball grid array on a face of the antenna substrate for mounting the antenna module to a circuit board, the ball grid array having an outer portion configured to define an air gap between the antenna and the circuit board and an inner portion configured to provide electrical connections between the circuit board and the semiconductor die.

17. The method of claim 16 further comprising mounting the antenna substrate to the circuit board such that an air gap is defined by the thickness of the ball grid array between the second face of the antenna substrate and a ground plane on the circuit board.

18. The method of claim 16, wherein the plurality of antenna elements are spaced with a half wavelength spacing.

19. A millimeter-wave radio antenna module comprising:
   an antenna substrate having a micro-strip antenna provided on a face thereof; and
   a semiconductor die including a wireless system IC, the die mounted on a face of the antenna substrate and configured to provide a signal to the micro-strip antenna,
   wherein a ball grid array is formed on a face of the antenna substrate for mounting the antenna module to a circuit board, the ball grid array being configured to define an air dielectric gap between the micro-strip antenna and the circuit board, and
   wherein the micro-strip antenna comprises a plurality of antenna elements spaced laterally across the antenna substrate to provide a phased antenna array, the plurality of antenna elements being spaced with a half wavelength spacing.

* * * * *